US 8,129,834 B2
Mar. 6, 2012

(12) United States Patent
Conn

(10) Patent No.: US 8,129,834 B2
(45) Date of Patent: Mar. 6, 2012

(54) INTEGRAL METAL STRUCTURE WITH CONDUCTIVE POST PORTIONS

(75) Inventor: Robert O. Conn, Hakalau, HI (US)

(73) Assignee: Research Triangle Institute, Research Triangle Park, NC (US)

( * ) Notice: Subject to any disclaimer, the term of this patent is extended or adjusted under 35 U.S.C. 154(b) by 387 days.

(21) Appl. No.: 12/321,833

(22) Filed: Jan. 26, 2009

(65) Prior Publication Data

US 2010/0187665 A1 Jul. 29, 2010

(51) Int. Cl.
*H01L 23/482* (2006.01)
*H01L 23/49* (2006.01)
*H01L 23/492* (2006.01)
*H01L 23/367* (2006.01)

(52) U.S. Cl. ........ 257/687; 257/691; 257/697; 257/712; 257/714; 257/E23.015; 257/E23.024; 257/E23.026; 257/E23.105

(58) Field of Classification Search .................. 257/687, 257/691, 697, 712, 714, E23.015, E23.024, 257/E23.105

See application file for complete search history.

(56) References Cited

U.S. PATENT DOCUMENTS

| | | | |
|---|---|---|---|
| 5,172,310 A | 12/1992 | Deam et al. | 363/144 |
| 5,208,491 A | 5/1993 | Ebeling et al. | 326/41 |
| 5,236,118 A | 8/1993 | Bower et al. | 228/193 |
| 5,511,428 A | 4/1996 | Goldberg et al. | 731/777 |
| 5,520,244 A * | 5/1996 | Mundinger et al. | 165/104.33 |
| 5,655,290 A | 8/1997 | Moresco et al. | 29/830 |
| 5,790,771 A | 8/1998 | Culbertson et al. | 714/3 |
| 5,805,533 A | 9/1998 | Daigle et al. | 368/226 |
| 5,834,705 A | 11/1998 | Jonaidi | 174/261 |
| 5,884,691 A * | 3/1999 | Batchelder | 165/80.3 |
| 5,891,761 A | 4/1999 | Vindasius et al. | 438/109 |
| 5,949,030 A | 9/1999 | Fasano et al. | 174/262 |
| 5,953,214 A * | 9/1999 | Dranchak et al. | 361/767 |
| 5,982,013 A * | 11/1999 | Kishi et al. | 257/467 |
| 6,097,086 A * | 8/2000 | Crane et al. | 257/692 |
| 6,206,705 B1 | 3/2001 | Bolotin et al. | 439/69 |
| 6,221,769 B1 | 4/2001 | Dhong et al. | 438/667 |
| 6,259,160 B1 | 7/2001 | Lopatin et al. | 257/762 |
| 6,379,982 B1 | 4/2002 | Ahn et al. | 438/14 |
| 6,555,467 B2 | 4/2003 | Hsu et al. | 438/633 |
| 6,598,216 B2 | 7/2003 | Chan et al. | 716/13 |
| 6,650,301 B1 | 11/2003 | Zimmerman | 343/803 |
| 6,660,564 B2 | 12/2003 | Brady | 438/119 |
| 6,694,464 B1 | 2/2004 | Quayle et al. | 714/725 |
| 6,768,205 B2 | 7/2004 | Taniguchi et al. | 257/774 |
| 7,048,548 B2 | 5/2006 | Mathieu et al. | 439/66 |
| 7,202,932 B2 * | 4/2007 | Niwa et al. | 349/154 |
| 7,409,610 B1 | 8/2008 | Drimer | 714/725 |

(Continued)

*Primary Examiner* — Victor A Mandala

(74) *Attorney, Agent, or Firm* — Imperium Patent Works; T. Lester Wallace; Zheng Jin

(57) ABSTRACT

A plurality of FPGA dice is disposed upon a semiconductor substrate. In order to supply the immense power required by the plurality of FPGA dice, power is routed through the semiconductor substrate vertically from thick metal layers and large integral metal structures located on the other side of the semiconductor substrate. Because the semiconductor substrate has a different coefficient of thermal linear expansion than metal layers in contact with the substrate, delamination may occur when the structure is subject to changes in temperature. To prevent delamination of metal layers connected to the semiconductor substrate and in electrical contact with the integral metal structures, the integral metal structures are manufactured with an array of post portions. During changes in temperature, the post portions of the integral metal structures bend and slide relative to metal layers connected to the semiconductor substrate and prevent linear stresses that may otherwise cause delamination.

20 Claims, 13 Drawing Sheets

U.S. PATENT DOCUMENTS

| | | | |
|---|---|---|---|
| 2002/0134581 A1 | 9/2002 | Figueroa et al. | 174/260 |
| 2002/0134685 A1 | 9/2002 | Chakravorty et al. | 205/125 |
| 2002/0163062 A1 | 11/2002 | Wang et al. | 257/641 |
| 2003/0107117 A1 | 6/2003 | Antonell et al. | 257/684 |
| 2004/0038195 A1 | 2/2004 | Nerenberg et al. | 435/4 |
| 2004/0179344 A1 | 9/2004 | Uchida et al. | 361/777 |
| 2005/0104221 A1 | 5/2005 | Memis | 257/778 |
| 2006/0027934 A1 | 2/2006 | Edelstein et al. | 257/774 |
| 2006/0125094 A1 | 6/2006 | Lin | 257/734 |
| 2006/0170110 A1 | 8/2006 | Akram et al. | 257/774 |
| 2006/0190846 A1 | 8/2006 | Hichri et al. | 716/1 |
| 2006/0226450 A1 | 10/2006 | Furuta et al. | 257/208 |
| 2007/0012475 A1 | 1/2007 | Kawaguchi et al. | 174/255 |
| 2007/0210400 A1 | 9/2007 | Moribayashi et al. | 257/440 |
| 2008/0054486 A1 | 3/2008 | Murayama et al. | 257/774 |
| 2008/0253085 A1 | 10/2008 | Soffer | 361/687 |
| 2009/0035664 A1* | 2/2009 | Chiang et al. | 429/317 |
| 2009/0202903 A1* | 8/2009 | Chiang et al. | 429/203 |
| 2010/0258966 A1* | 10/2010 | Sandhu | 264/104 |

* cited by examiner

INTEGRAL METAL STRUCTURE WITH CONDUCTIVE POST PORTIONS

TECHNICAL FIELD

The present invention generally relates to prevention of delamination or separation of layers of different materials in semiconductor packaging; more specifically to prevention of delamination in semiconductor packaging incorporating a semiconductor substrate.

BACKGROUND INFORMATION

The current state of the art of semiconductor development is the mass production of large integrated circuits "IC's" containing several million active components. One type of device fitting this description is a large Field Programmable Gate Array "FPGA." FPGAs and other devices may operate at speeds of several hundred Megahertz and it is not unusual that these integrated circuits include over a thousand pins that bring high speed signals into and out of the integrated circuit die. With a large number of active internal components switching at high speeds, these devices consume large amounts of power. In a system containing several of these and other circuits it is desirable to have a substrate that is optimized for both density of high speed signal conductors and low resistance power connections.

A drawing of a semiconductor substrate optimized for thousands of high density conductors available for high speed signal routing and both low resistance connections for power is shown in FIG. 1. A semiconductor substrate 25 has a plurality of FPGA dice 27-30 disposed upon its surface. The semiconductor substrate contains a thin conductor layers portion characterized as having a plurality of thin fine-pitch conductors. These fine-pitch conductors are used to make high speed and other signal connections between the multiple FPGA dice 27-30. For the power connections to the FPGA dice, thick conductors and vertical through-holes are utilized. The through-holes, electrically couple thick conductors on the bottom plane of the semiconductor substrate to thick conductors present on multiple layers below the plurality of FPGA dice. Power bus bar structures 80 are in mechanical contact with the thick conductors underneath the semiconductor substrate 25 and are also in electrical contact with these thick conductor layers on the bottom plane of semiconductor substrate 25. Power bus bar structures 80 extend underneath the entire length of the semiconductor substrate. Braided copper edge connectors, not shown in FIG. 1, are connected to the power bus bar structures 80 and are used to couple power signals to the power bus bar structures.

Another drawing of a semiconductor substrate with power bus bar structures is shown in FIG. 2. FIG. 2 contains a semiconductor substrate 25, partial FPGA die 27, coupling capacitors 87-88, Thick conductive metal layer 21, and a plurality of power bus bar structures 81-84. Conductive metal layer 21, which may be made of copper, is shown attached to a silicon portion of semiconductor substrate 25 and may be approximately eight microns thick. Power bus bar structures 81-84, are of sufficiently large cross section in order to supply power to FPGAs 27-30 and are each approximately one millimeter wide by one and one-half millimeters in height. If the power bus bars are soldered to conductive metal layer 21 there is sufficient electrical connection but the physical connection to conductive layer 21 and the semiconductor substrate may be subject to delamination during changes in temperature. For example, the coefficient of thermal linear expansion for power bus bars made of copper is seventeen parts per million per degree Centigrade "ppm/° C." The same coefficient for silicon is three ppm/° C. If a semiconductor substrate with copper power bus bars two inches in length experiences a change in temperature of one-hundred degrees Centigrade, the copper power bus bars 81-84 would expand approximately thirty five microns more than the semiconductor substrate 25 at each end of the semiconductor substrate. With this disparity, it is likely the thick copper power bus bars soldered to conductive metal layer 21 would separate from the semiconductor body attached to conductive metal layer 21. While soldering of the silicon substrate to the copper bus bars provides sufficient electrical contact, its bonded contact is likely insufficient to withstand linear stresses caused by thermal expansion and contraction of the copper bus bars when subjected to changing temperature. A reliable physical connection is desired while still maintaining robust electrical connection.

SUMMARY

A plurality of FPGA dice or other components are disposed upon a semiconductor substrate. A semiconductor substrate that can supply the immense amount of power required for these types of devices and connect thousands of interconnect lines between the FPGA die is described in application Ser. No. 11/975,966 (incorporated herein by reference). Instead of soldering power bus bars to the semiconductor substrate, integrated metal structures are utilized to supply power to the semiconductor substrate. The integrated metal structures have features which allow the integrated metal structures to slide relative to the semiconductor substrate yet remain in electrical contact with the semiconductor substrate. Because the layers are slideably coupled together, forces that may cause delamination are dissipated while electrical contact is maintained.

In one novel aspect of the invention, a metal structure is processed to create a plate portion and an array of at least one hundred post portions extending from the plate portion. When brought into contact with the conductive metal of the semiconductor substrate, the post portions bend and crush. When the system is subjected to horizontal stress caused by temperature expansion and contraction, the metal will bend and crush even further. When temperature is increasing the integral metal structures will expand linearly according to their coefficient of thermal linear expansion. An integral metal structure constructed of copper will have a coefficient of thermal linear expansion of approximately 17 ppm/° C. The silicon portion of the semiconductor substrate has a coefficient of thermal expansion closer to 3 ppm/° C. Because the coefficient of expansion for the integral copper structure is several times that of the silicon in the semiconductor substrate, the integral copper structure will expand at a greater rate than semiconductor substrate. The post portions of the integral metal structure bend and allow the semiconductor substrate and layers of the conductive metal attached to the semiconductor substrate to remain in a constant and low resistance contact with the integral metal structure. The post portions should be of a length that is longer than the total difference in linear expansion of the semiconductor substrate and the integral metal structure over an expected change in temperature. For example, if the semiconductor substrate and integral copper metal structure is two inches in width and expected to operate over a difference in temperature of 100° C., the semiconductor substrate and the copper power bus bars would expand or contract in each direction approximately 41.9 microns and 7.6 microns respectively. Thus an integral metal structure made of copper will expand approximately 34.3 microns farther than the semiconductor substrate. The posts of the post portions subsequently bend at least the same distance. In one embodiment the post portions may be fifty microns tall. Post portions fifty microns tall can be created by laser-etching or by damascene processing techniques. In some embodiments the tip of each post in the post portions will have a rounded tip to facilitate bending when in contact with the surface of the semiconductor substrate.

In another novel aspect of the invention, posts are formed on a planar portion of the integral metal structure and on the surface of the semiconductor substrate that contacts the integral metal structures. In such an embodiment, the post portions of the semiconductor substrate and the post portions of the integral metal structure will slide and bend in relation to each other during temperature expansion and contraction. This will allow the semiconductor substrate and the integral metal structure to remain in constant low resistive contact with each other during temperature expansion and contraction.

In another novel aspect of the invention, fuzz buttons are disposed between an integral metal structure and metal layers connected to the semiconductor substrate. Fuzz buttons may be gold-plated beryllium-copper wire contacts manufactured from a single strand of wire and compressed into a spherical or cylindrical shaped bundle. Because fuzz buttons are not adhesively fixed to either the first metal structure or metal layers attached to the semiconductor substrate, delamination is not likely to occur when the invention is subject to temperature changes. Stress caused by a disparate amount of thermal expansion between metal structures is dissipated by sliding of the metal structures relative to the fuzz buttons.

In another novel aspect of the invention, braided copper cable is disposed between the large integral metal structures and metal layers attached to the semiconductor substrate. Because the braided copper cable is not adhesively fixed to either metal structure, delamination is not likely to occur when the invention is subject to temperature changes. Stress between the metal structures and the semiconductor substrate caused by a disparate amount of thermal expansion between the structures is dissipated by sliding of the metal structures relative to the braided copper cable. In other embodiments, the braided copper cable is bonded together with the large integral metal structures and metal layers attached to the semiconductor substrate. Stress between the metal structures and the semiconductor substrate caused by a disparate amount of thermal expansion between the structures is dissipated by sliding of the metal braids of the braided copper cable. In yet another embodiment, the braided copper cable is used to bring power to a metal layer of the semiconductor substrate in place of an integral metal structure.

In yet another novel aspect of the invention, a first metal structure is patterned with features and a second metal structure is patterned with a complimentary pattern that is oversized such to allow for the features of the first metal structure to fit together with lateral gaps between the complimentary features. The lateral gaps serve to reduce the amount of surface area of the first metal structure that is in contact with the second metal structure. The gaps also allow the first metal structure to slide relative to the second metal structure. If the gaps were not present, features such as bumps or other structures present on the surface of each metal layer would press against each other during thermal expansion. The forces caused by this expansion may shear off bumps or other structures. But the presence of gaps allows the two surfaces to slide relative to each other when the system is subject to temperature changes. The sliding allows the metal structures to remain in electrical contact but prevents forces that may cause shearing off of the features or delamination of the metal structures from other layers.

Further details, embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Figure 3:
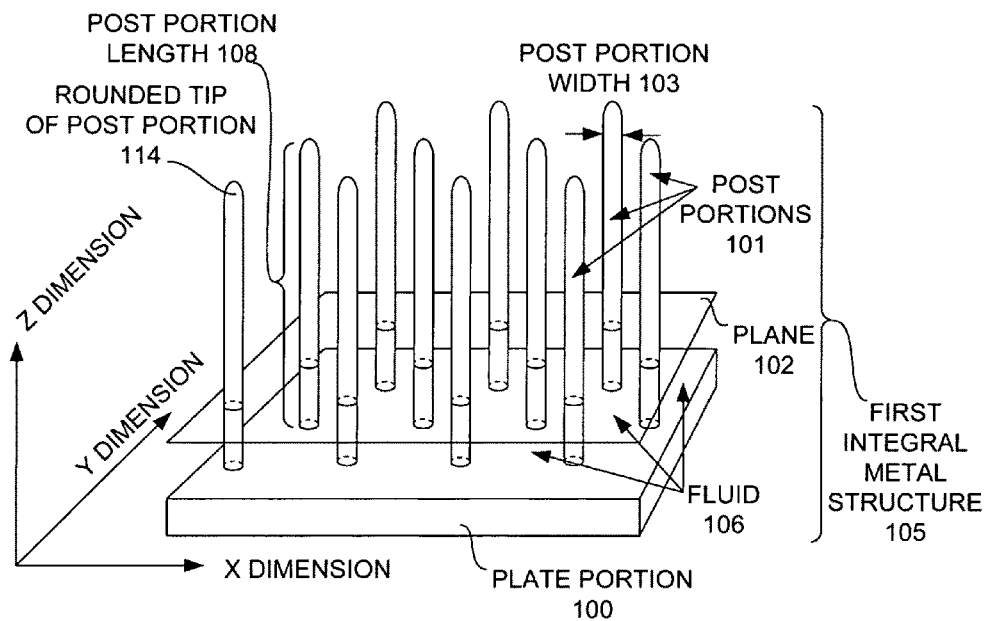
FIG. 3 is a perspective view of an integral metal structure with an array of post portions in accordance with one novel aspect.

FIG. 3 is a drawing of a first integral metal structure 105 in accordance with one novel aspect. The first integral metal structure contains a plate portion 100, an array of a least one hundred post portions 101, and a plane 102 that is parallel to plate portion 100. Plate portion 100 has a two-dimensional planar surface which extends in an X dimension and a Y dimension. A plane 102 extends in the X dimension and Y dimension and is parallel to plate portion 100. The array of post portions 101 have a width 103, extend from plate portion 100 for a length 108 in the Z dimension, and have a rounded tip 114. Plane 102 intersects each post portion 101 in a cross-sectional dimension. In this cross-sectional dimension, fluid 106 surrounds each post portion 101. Each post portion 101 is electrically shorted to both plate portion 100 and all other post portions 101. Post portions 101 are integral to plate portion 100. In one embodiment the first integral metal structure is approximately one and one-half millimeters in height, one millimeter wide, greater than one inch in the X dimension, and includes copper. In other embodiments the first integral metal structure is made of another conductive metal or an alloy of conductive metals. The plate portion 100 of first integral metal structure 105 has a thickness in the Z dimension of at least one-half millimeter and in one novel aspect is almost one and one-half millimeters in thickness. In another embodiment of the first integral metal structure, each post portion 101 is one micron wide and extends a length of at least ten microns from plate portion 100 in the Z dimension. In other embodiments the post portions 101 are of different post portion width 103 and post portion length 108. In one novel aspect fluid 106 is air and in other embodiments the fluid may be a liquid coolant or other fluid.

Figure 4:
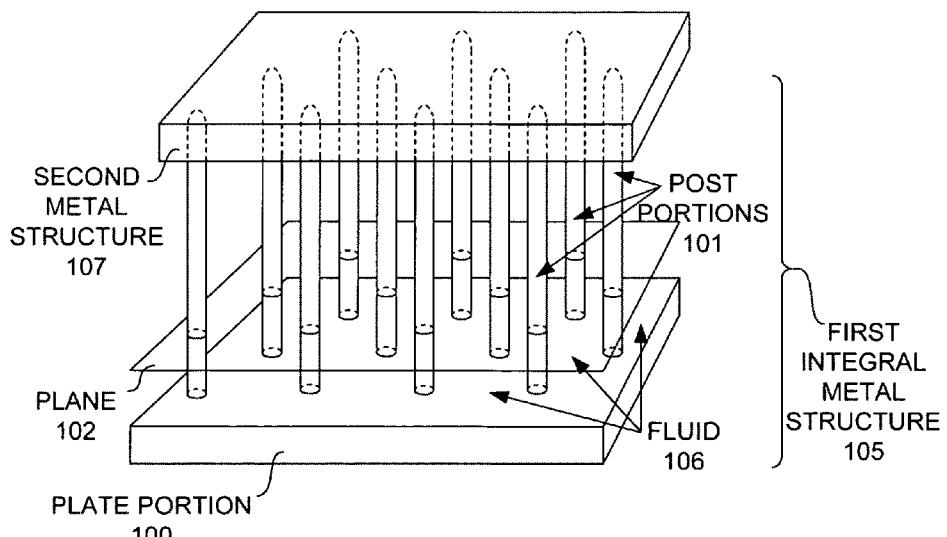
FIG. 4 is a perspective view of an integral metal structure with an array of post portions in electrical contact with a second metal structure in accordance with one novel aspect.

FIG. 4 is a perspective view of integral metal structure 105 with array of post portions 101 and a second metal structure 107 in accordance with one novel aspect. The second metal structure 107 is pressed together with first integral metal structure 105 and is in electrical contact with the rounded tip portion 114 of each post portion 101. In one embodiment second metal structure 107 is made of copper; in other embodiments second metal structure 107 may be copper coated with nickel or another metal and then a gold layer. Gold on the surface of a barrier metal layer on the surface of second metal structure 107 will cause the surface in contact with post portions 101 to be more resilient when exposed to changes in temperature. Gold is non-oxidizing. In another embodiment gold is also disposed on the surface of post portions 101 and plate portion 100 of first integral metal structure 105 after first depositing nickel or another barrier metal. The barrier metal prevents gold from diffusing into the copper metal structures. In one embodiment, the second metal structure 107 is approximately eight microns in thickness, is part of a semiconductor substrate and attached to a semiconductor body. During changes in temperature, the first integral metal structure may expand in the X dimension in an amount greater than second metal structure 107. In this situation, the post portions 101 bend and slide relative to the second metal structure 107. The rounded tips 114 of post portions 101 have a smooth surface to allow second metal structure 107 to more easily slide in relation to the post portions 101 during expansion caused by change in temperature.

Figure 1:
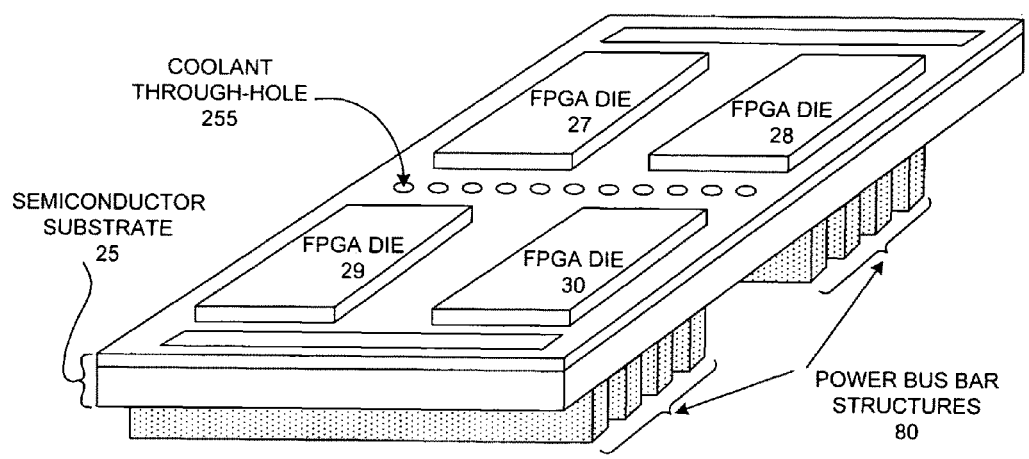
FIG. 1 is a perspective view of a plurality of integrated circuit dice mounted on a semiconductor substrate attached to a plurality of power bus bars.
Figure 5:
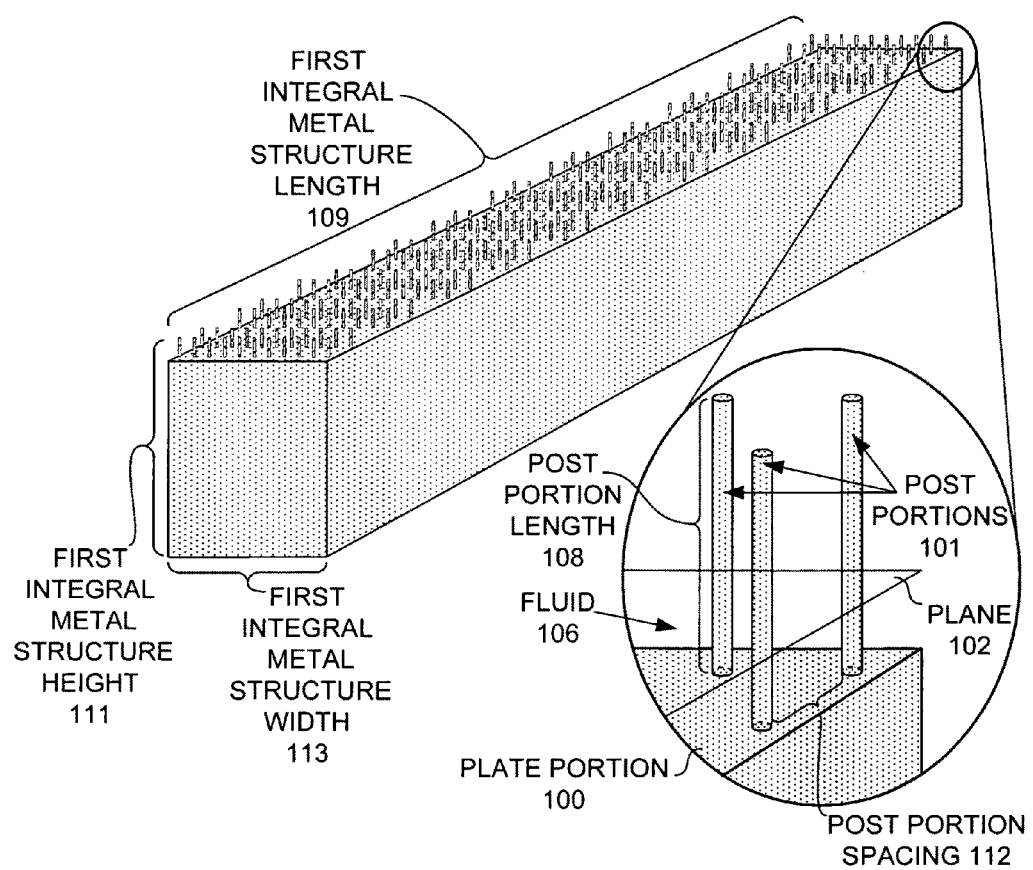
FIG. 5 is a perspective view of an integrated metal structure with an array of post portions showing one area of the integral metal structure in greater magnified detail.

FIG. 5 is a perspective view drawing of a first integral metal structure 105 showing first integral metal structure length 109, first integral metal structure height 111, and first integral metal structure width 113. A magnified drawing of a portion of first metal structure 105 is also shown in FIG. 5. The magnified drawing shows plate portion 100, post portions 101, and plane 102. Post portion length 108 and post portion spacing 112 are also shown in the magnified drawing portion of FIG. 5. In one novel aspect first integral metal structure length 109 is two inches, first integral metal structure width 113 is one millimeter, and first integral metal structure height 111 is one and one-half millimeters. In the same embodiment, post portions 101 extend from plate portion 100; post portion length 108 is fifteen microns and post portion spacing 112 is ten microns. In other embodiments the height 111, width 113, and length 109 of first, integral metal structure 105 are of different dimensions and the length, width, and spacing of post portions 101 may also be of different dimensions. When the first integral metal structure of FIG. 5 is connected to a second metal structure that is part of a semiconductor substrate, first integral metal structure length 109 is approximately the same length as the semiconductor substrate. First integral metal structure width 113 and the first integral metal structure height are of sufficient cross-section to conduct current sufficient for supplying power to FPGA dice 27-30 disposed on the surface of the semiconductor substrate 25 of FIG. 1.

Figure 6:
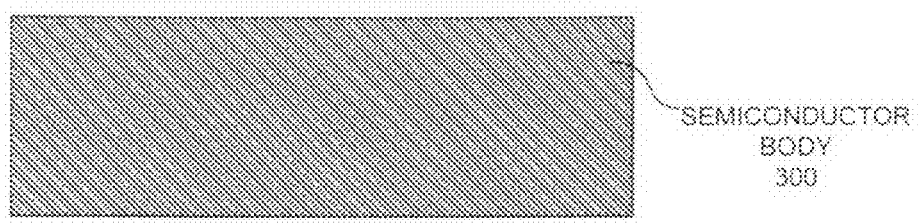
FIG. 6 is a cross-sectional view of a semiconductor body. The semiconductor body will be subsequently patterned and etched in a desired manner.
Figure 7:
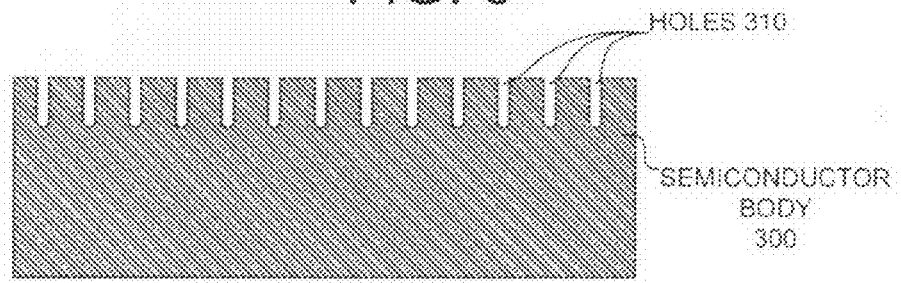
FIG. 7 is a cross-sectional drawing of a semiconductor body wherein a plurality of holes has been etched into one surface of the semiconductor body.
Figure 8:
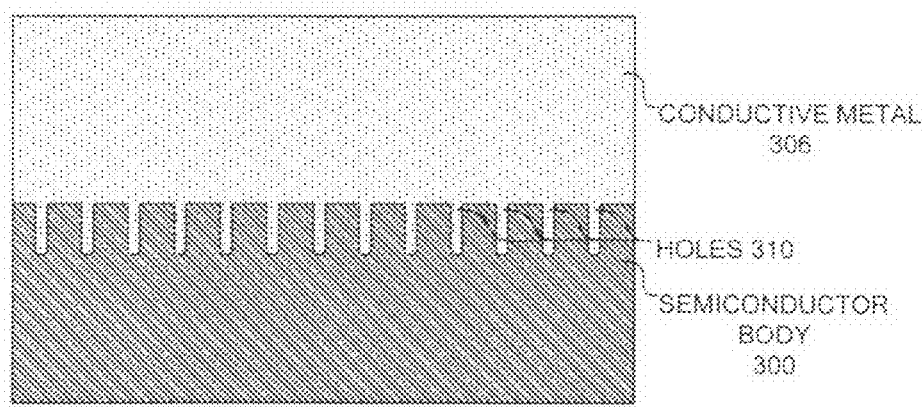
FIG. 8 is a cross-sectional drawing showing a conductive metal layer deposited onto the etched semiconductor body of FIG. 7.
Figure 9:
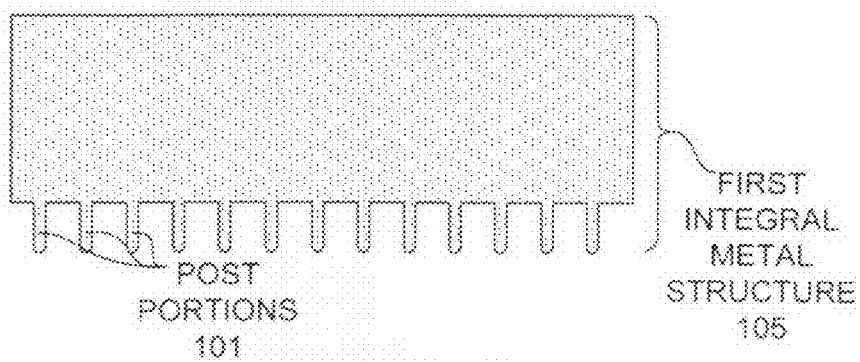
FIG. 9 is a cross-sectional drawing showing a first integral metal structure with post portions formed by removing all remaining semiconductor body from the conductive metal layer in FIG. 8.

FIG. 6 is a cross-sectional diagram of a semiconductor body 300 used to create first integral metal structure 105. FIG. 7 is a cross-sectional diagram of semiconductor body 300 and a plurality of holes 310. The plurality of holes 310 is shown vertically extending into semiconductor body 300. The holes 310 are created by reactive ion etching the semiconductor body until holes extend into the semiconductor body a desired distance. The holes 310 may extend deeper into semiconductor body 300 at their centers as a result of the etching process. In one embodiment, holes 310 are one micron in width, at least fifteen microns in height, and separated from other holes by a spacing of ten microns. In an alternative embodiment, holes 310 are created by laser etching the semiconductor body 300. FIG. 8 is a cross-sectional diagram of semiconductor body 300 with a plurality of holes 310 extending into semiconductor body 300 and a conductive metal layer 306 filling holes 310 and extending from semiconductor body 300. In one novel aspect conductive layer 306 is copper and is deposited onto semiconductor body 300 and into holes 310. In other embodiments, conductive layer 306 may be another conductive metal or conductive metal alloy. FIG. 9 is a cross-sectional drawing of a first integral metal structure 105 with post portions 101. First integral metal structure 105 was created by removing semiconductor body 300 from the conductive metal 306 of FIG. 8 by reactive ion etching. First integral metal structure 105 is then singulated into sections of suitable length and width for attachment to semiconductor substrates.

An alternative method for forming first integral metal structure 105 of FIG. 3 starts with a metal substrate and then etching the metal substrate to create post portions 101 of FIG. 3. This is performed by depositing an etchant onto the metal substrate and forming a pattern by exposing the portions of the etchant to light. Afterwards, the metal substrate and etchant is processed to remove an amount of metal necessary to process a desired post portion length. The remaining substrate can than be singulated into sections of suitable length and width for attachment to semiconductor substrates.

Figure 2:
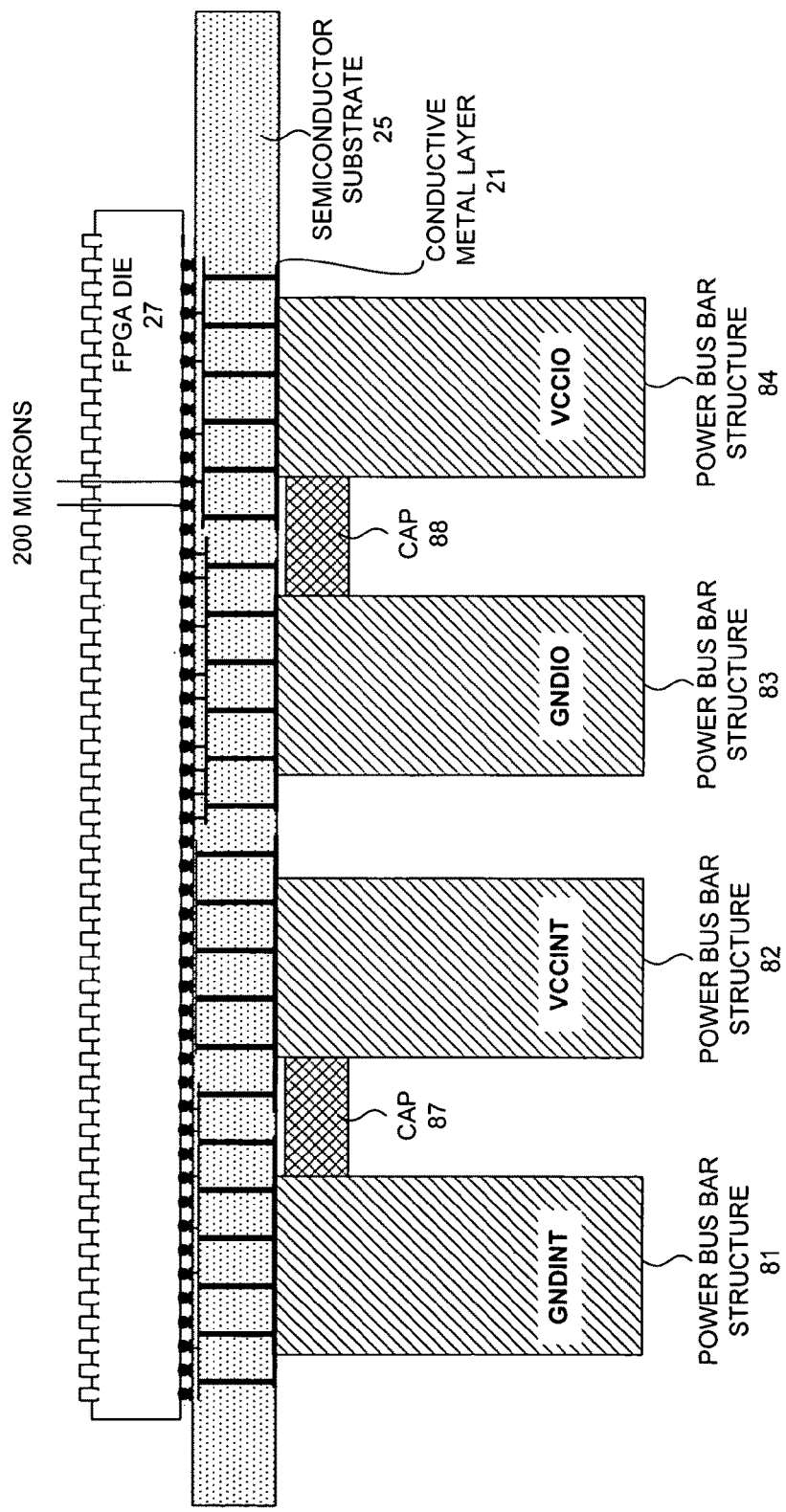
FIG. 2 is a cross-sectional drawing of a semiconductor substrate showing a partial FPGA die, a semiconductor substrate and plurality of power bus bar structures in contact with the semiconductor substrate.
Figure 10:
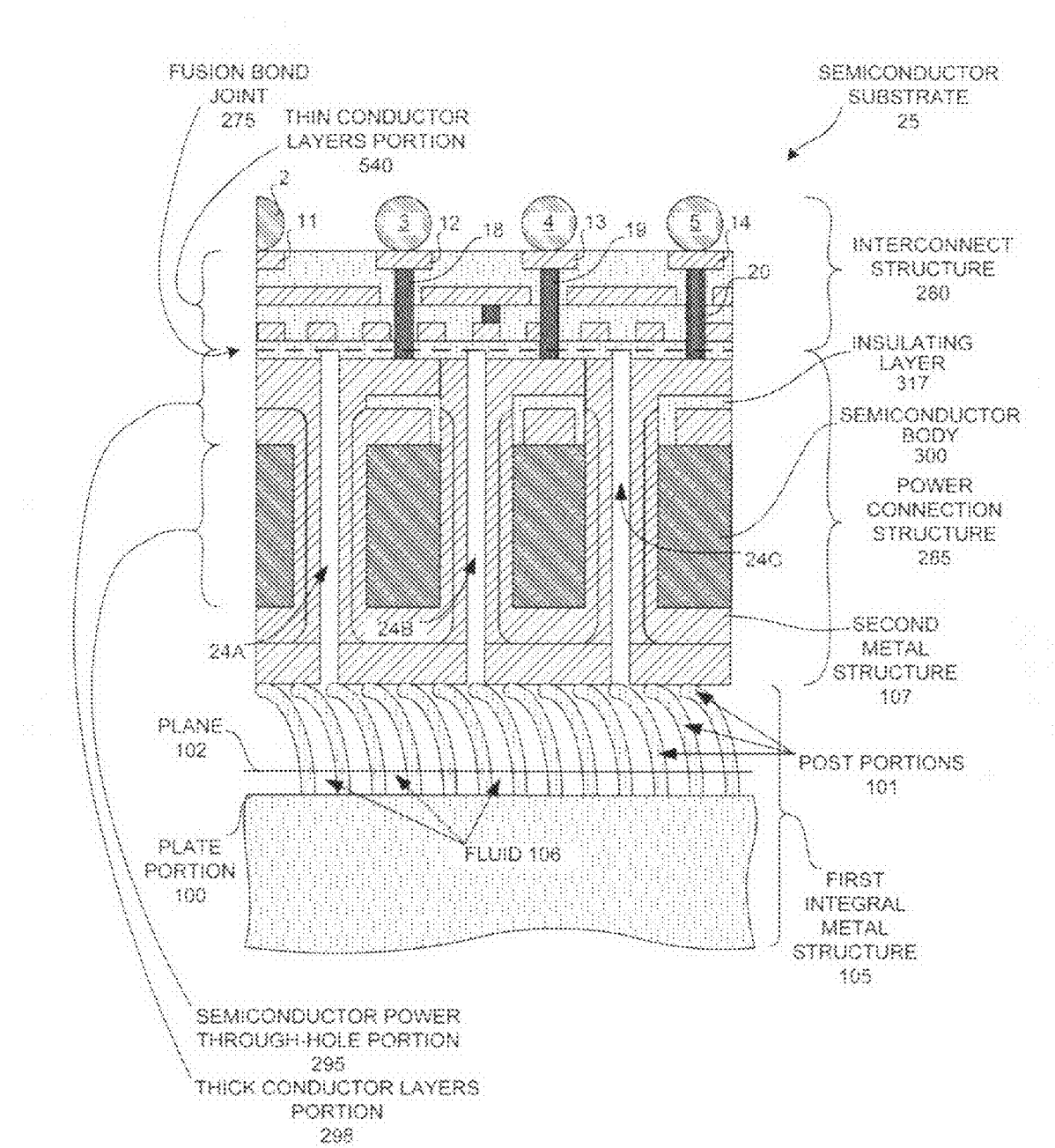
FIG. 10 is a cross-sectional drawing through a semiconductor substrate and a first integral metal structure. A second metal structure at the bottom surface of the semiconductor substrate is in electrical contact with post portions of the first integral metal structure.

FIG. 10 is a cross-sectional drawing of the semiconductor substrate 25 of FIG. 2 attached to a first integral metal structure 105. Semiconductor substrate 25 has an interconnect structure 280 containing a "thin conductor layers portion" 540. Thin conductor layers portion 540 is characterized as having a plurality of thin fine-pitch conductors and is disposed onto a "power connection structure" 285. A plurality of thick horizontal conductors is disposed within a "thick conductor layers portion" 298 within the power connection structure and a plurality of through-holes 24A-24C extends vertically through a semiconductor body 300 of a semiconductor power through-hole portion 295 within the power connection structure 285. These thick horizontal conductors present within the power connection structure 285 are of a thickness of approximately two microns or greater. A conductive via is disposed within each through-hole, 24A-24C. A plurality of die bonding bumps 2-5 is disposed upon the thin conductor layers portion 540. The die bumps 2-5 are arrayed to match the corresponding array of lands 11-14 present on the FPGAs to be disposed onto the semiconductor substrate. The die bonding bumps 2-5 conduct power to the FPGA dice through vertical vias within through-holes 24A-24C to thick horizontal conductive layers present within the thick conductor layers portion 298. The thick conductor layers are then electrically coupled to a second metal structure 107 present on the bottom plane of the semiconductor power through-hole portion 295 by the conductive vias disposed within the semiconductor power through-hole portion 295. A first integral metal structure 105 is pressed against second metal structure 107 and is in electrical contact with second metal structure 107. First integral metal structure 105 includes post portions 101, fluid 106, and a plate portion 100. In this manner, a large amount of current required by the FPGA devices is conducted horizontally through plate portion 100 of the first integral metal structure 105, then vertically through post portions 101 of the first integral metal structure 105 to the second metal structure 107 of power connection structure 285 to thick conductors within the thick conductor layers portion 298 to vias 18-20 extending through the interconnect structure 280 to lands 11-14 and then to die bonding bumps 2-5 that interface to the power connections disposed upon the surface of the FPGA. This provides for low resistance power connections through the substrate while simultaneously allowing the maximum density of thin fine-pitch conductor interconnects within the interconnect structure 280 for routing signals between the plurality of FPGA dice disposed on the semiconductor substrate 25.

In this FIG. 10 and in accordance with one novel aspect, the first integral metal structure is made of copper which has a coefficient of thermal expansion of approximately seventeen ppm/° C. The semiconductor power through-hole portion 295 of the semiconductor substrate 25 has a coefficient of thermal expansion closer to three ppm/° C. If the temperature of the system changes by thirty degrees Centrigrade, the first metal structure will expand and contract approximately five and one half microns. However, the semiconductor body will only expand 1.1 microns in each direction. In one novel aspect, the post portions 101 bend to prevent delamination of the second metal structure 107 from semiconductor power through-hole portion 295. In another novel aspect, post portions 101 slide along the lower surface of second metal structure 107 as first integral metal structure expands and contracts a greater distance than semiconductor power through-hole portion 295 and second metal structure 107.

Figure 11:
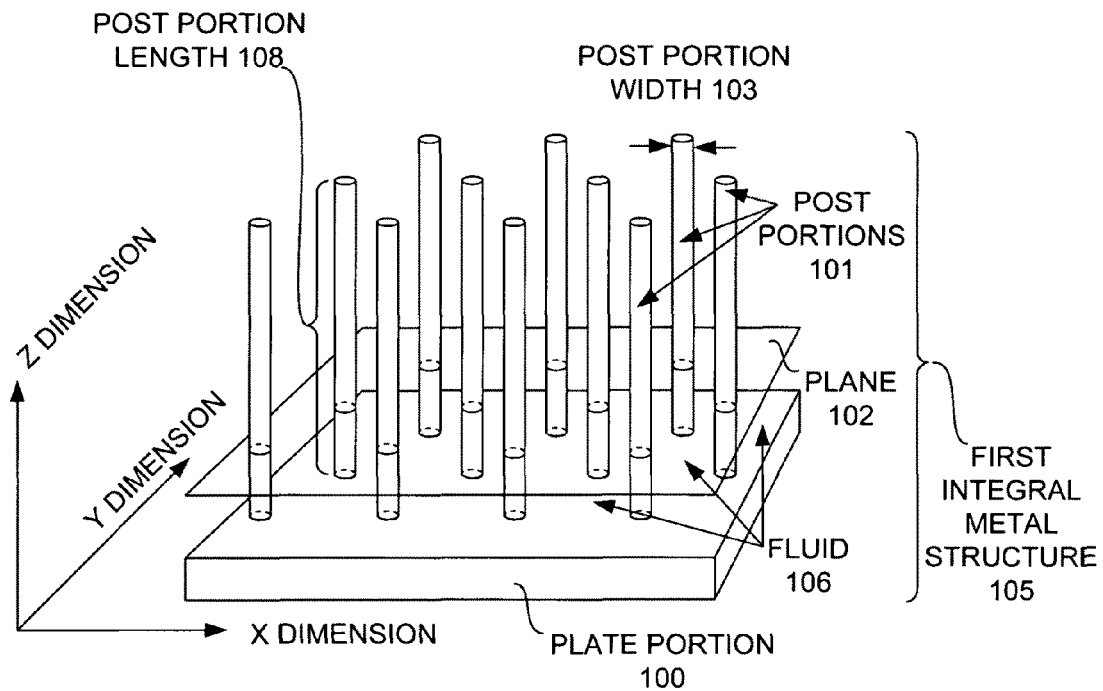
FIG. 11 is a perspective view of an integral metal structure with an array of post portions; each post portion having a flat tip portion.

FIG. 11 is a drawing of a first integral metal structure 105 in accordance with another novel aspect. The first integral metal structure contains a plate portion 100, an array of at least one hundred post portions 101, and a plane 102 that is parallel to plate portion 100. Plate portion 100 has a two-dimensional planar surface which extends in an X dimension and a Y dimension. A plane 102 extends in the X dimension and Y dimension and is parallel to plate portion 100. Post portions 101 have a width 103 and extend from plate portion 100 for a length 108 in the Z dimension. In this embodiment, post portions 101 have a flat surface at the end of post portion length 108 opposite of plate portion 100. The flat ends of post portions 101 can be processed by adding an etch-stop or barrier layer to semiconductor body 300 of FIG. 6 and then by processing holes 310 completely through semiconductor body 300 to the etch-stop or barrier layer. A metal layer is then deposited followed by processing to remove the semiconductor body and etch-stop or barrier layer.

Figure 12:
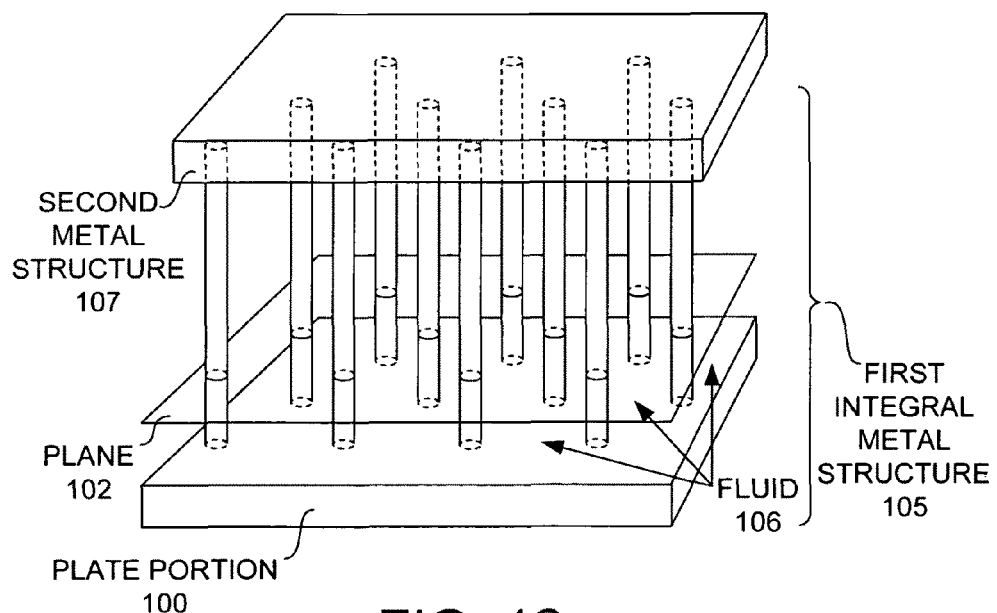
FIG. 12 is a perspective view of an integral metal structure with an array of post portions; each post portion having a flat tip portion in electrical contact with a second metal structure in accordance with one novel aspect.

FIG. 12 is a perspective view showing integral metal structure 105 with array of post portions 101 in contact with a second metal structure 107 in accordance with the novel aspect of FIG. 11. The second metal structure 107 is pressed together with first integral metal structure 105 and is in electrical contact with each post portion 101.

Figure 13:
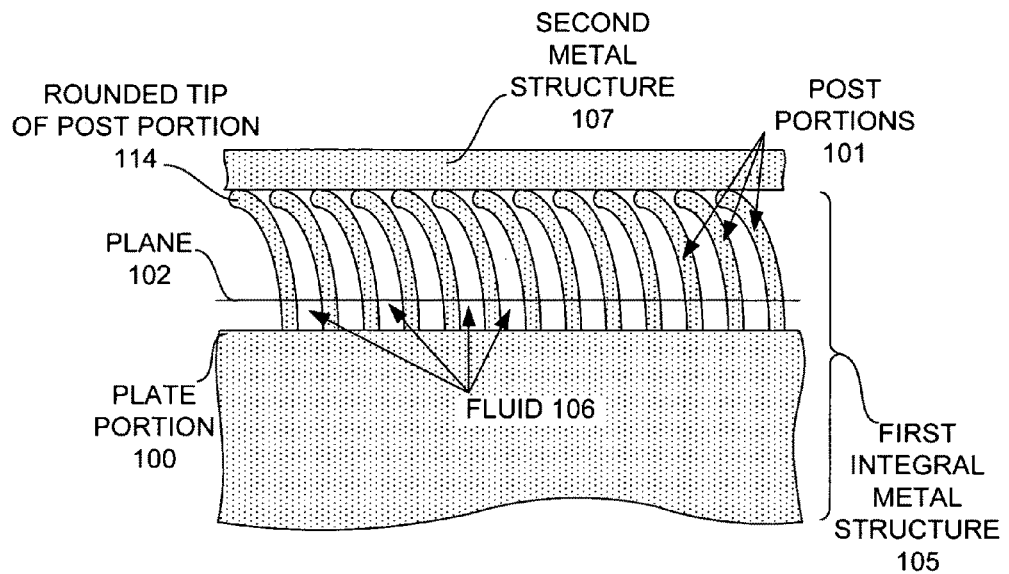
FIG. 13 is a cross-sectional drawing through a first integral metal structure and a second metal structure showing post portions of the first integral metal structure in electrical contact with the second metal structure.
Figure 14:
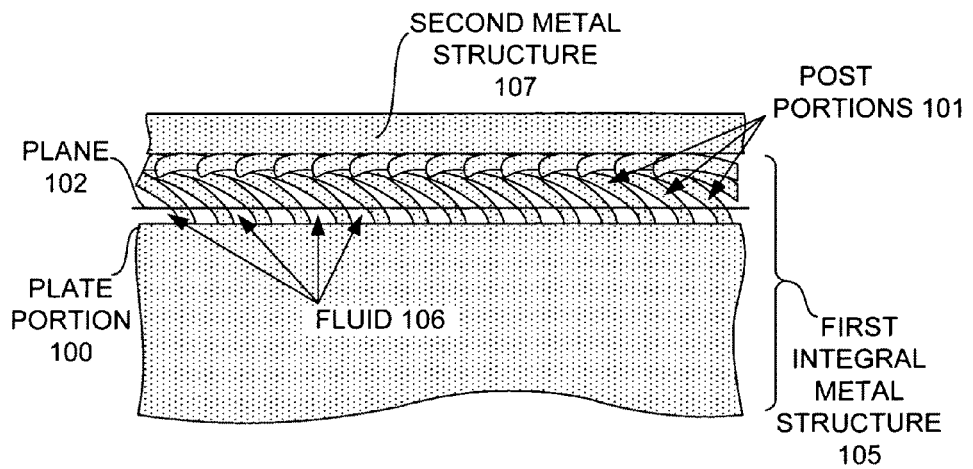
FIG. 14 is a cross-sectional drawing through a first integral metal structure and a second metal structure showing post portions of the first integral metal bending in response to expansion of the metal structures.

FIG. 13 is a cross-sectional view of a first integral metal structure 105 in physical and electrical contact with second metal structure 107. First integral metal structure contains post portions 101, plate portion 100, plane 102, and fluid 106. Post portions 101 are shown extending from plate portion 100. In a cross-sectional area defined by plane 102, each of post portions 101 is surrounded only by fluid 106. In one embodiment, second metal structure 107 is approximately eight microns in thickness, is pressed to together with first integral metal structure 105, is in contact with the rounded tip 114 of each post portion 101, and there are at least 100 of post portions 101. FIG. 14 is a cross sectional view of the first integral metal structure 105 and second metal structure 107 of FIG. 13. The post portions 101 in FIG. 14, however, are shown bending in response to expansion caused by change in temperature. Because second metal structure 107 is pressed against first integral metal structure 105, as post portions 101 bend more in response to expansion, second metal structure 107 is pressed closer to first integral metal structure 105.

Figure 15:
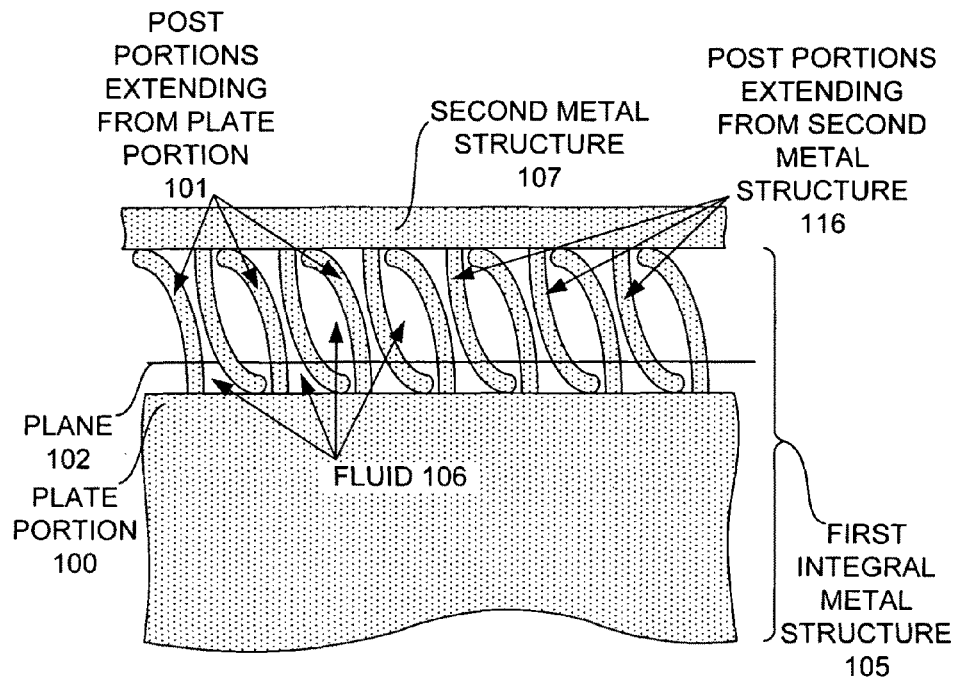
FIG. 15 is a cross-sectional drawing through a first integral metal structure and a second metal structure showing post portions of both the first integral metal structure and the second metal structure in accordance with one novel aspect.

FIG. 15 is a cross-sectional diagram of the invention in accordance with another novel aspect. FIG. 15 includes a first integral metal structure 105 with a plane 102, plate portion 100, post portions 101, and fluid 106. FIG. 15 also includes a second metal structure 107 with post portions 116 extending from second metal structure 107. Post portions 101 of first integral metal structure are pressed together with second metal structure 107 and are in electrical contact with second metal structure 107. Post portions 116 extend from second metal structure 107 and are pressed together with plate portion 100 of first integral metal structure 105. Post portions 101 and post portions 116 are surrounded by fluid 106 in a cross-sectional dimension. Post portions 101 and post portions 116 are also in physical and electrical contact with each other and during expansion caused by temperature change, post portions 101 and 116 slide and bend to relieve stresses caused by different materials having disparate coefficients of thermal expansion. Post portions 116 are manufactured in a similar manner as post portions 101, by reactive ion etching or laser etching.

Figure 16:
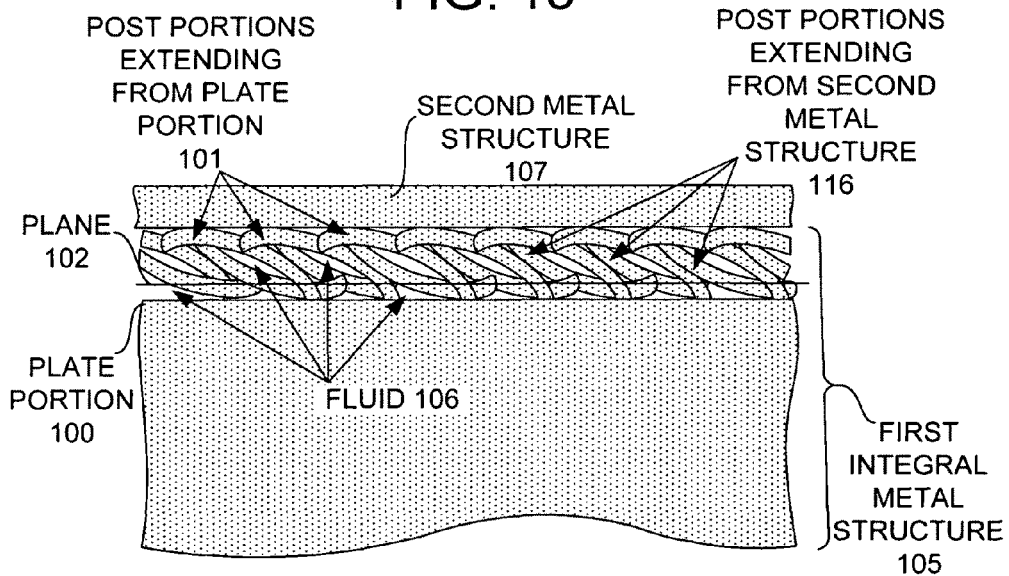
FIG. 16 is a cross-sectional drawing through a first integral metal structure and a second metal structure showing post portions of both the first integral metal structure and the second metal structure; wherein the post portions are bending in response to thermal expansion of the metal structures.

FIG. 16 shows a cross sectional view of the first integral metal structure 105 and second metal structure 107 of FIG. 15. The post portions 101 and 116 in FIG. 16, however, are shown bending in response to expansion and contraction caused by change in temperature. Because second metal structure 107 is pressed against first integral metal structure 105, as post portions 101 and 116 bend in response to expansion, second metal structure 107 and first integral metal structure 105 are pressed closer together.

Figure 17:
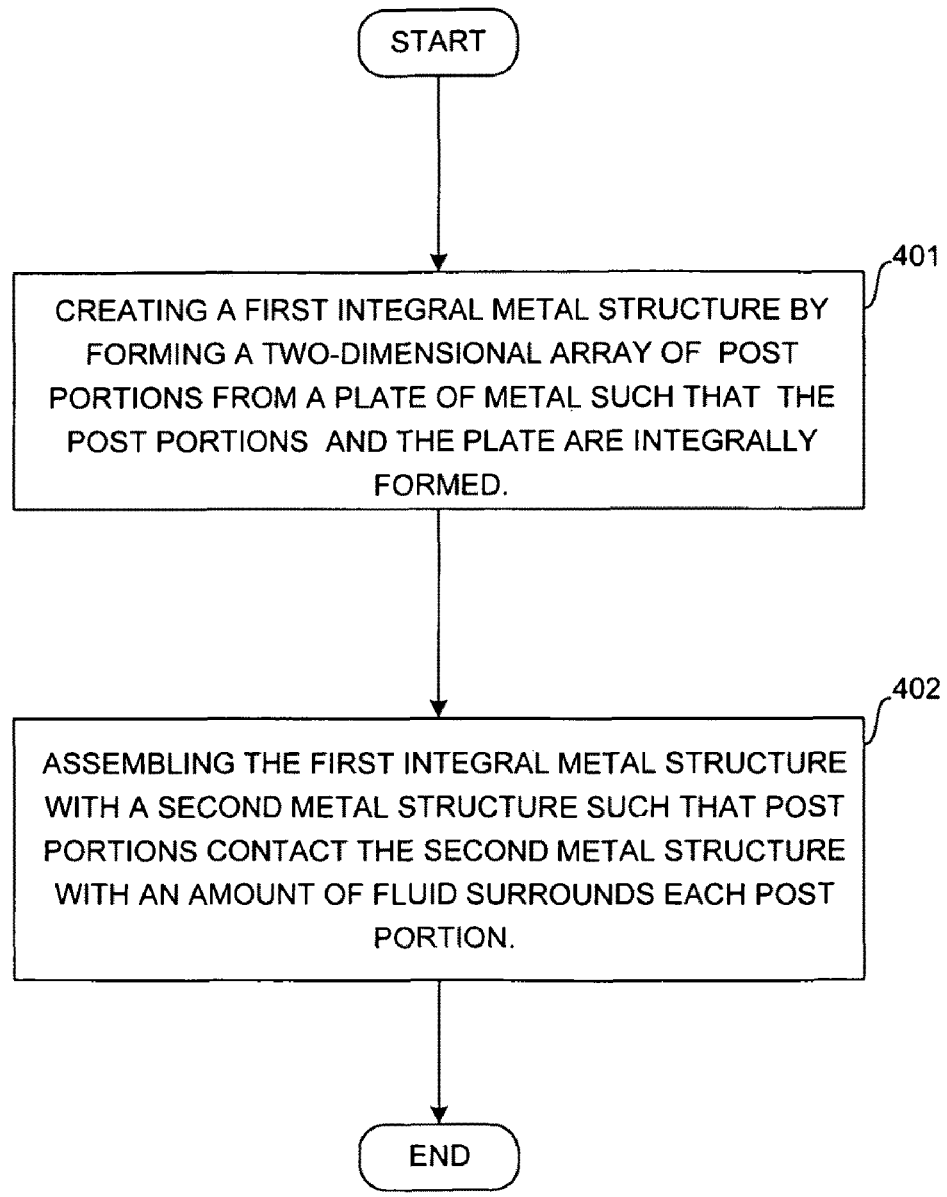
FIG. 17 is a flowchart of a novel method of making contact between an integral metal structure and a second metal structure.

FIG. 17 is a flowchart of a novel method of making an integral metal structure. In a first step 401 a first metal structure is processed to include at least one-hundred post portions. The post portions extend from a plate portion for a length greater than 10 microns and have a width which is less than one-fifth of the post portion length. The post portions extend from the plate portion in a Z dimension which is perpendicular to a plane extending in an X dimension and a Y dimension. The plane extending through all post portions in a cross-sectional dimension. In a second step 402, the post portions of the first integral metal structure are brought into contact with a second metal structure such that all post portions are surrounded by an amount of fluid in the cross-sectional dimension.

Figure 18:
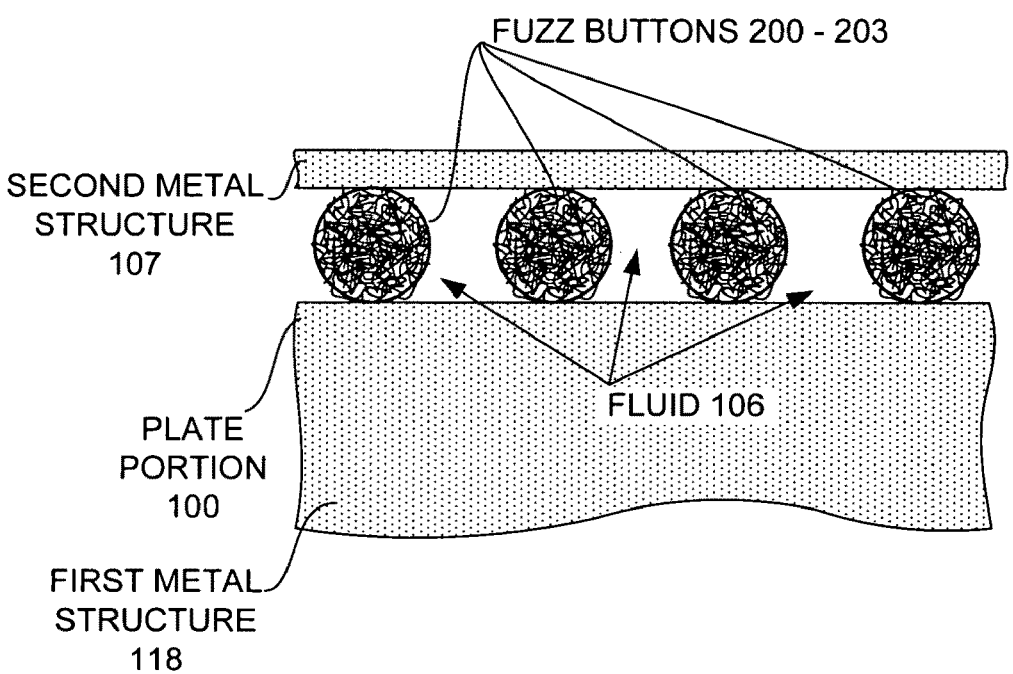
FIG. 18 is a cross-sectional drawing through a first metal structure and a second metal structure wherein fuzz buttons are in electrical contact with the first and second metal structures in accordance with one novel aspect.

FIG. 18 is a cross-sectional drawing showing another embodiment of the invention. FIG. 18 includes a first metal structure 118 with a plate portion 100; a second metal structure 107; and fuzz buttons 200-203. Fuzz buttons may be made of gold-plated beryllium-copper wire contacts manufactured from a single strand of wire and compressed into a spherical or cylindrical shaped bundle. The fuzz buttons are disposed between plate portion 100 of first metal structure 118 and second metal structure 107. When first metal structure 118 is pressed against second metal structure 107, the fuzz-buttons compress between the respective metal structures and are electrically connected to the metal structures. Because the fuzz buttons are not adhesively fixed to either the first metal structure 118 or second metal structure 107, delamination is not likely to occur when the structure is subject to temperature changes. Stress between the plate portion 100, fuzz buttons 200-203, and second metal structure 107 caused by a disparate amount of linear expansion between first metal structure 118 and second metal structure 107 should be dissipated by sliding of the plate portion of first metal structure 118 relative to the fuzz buttons 200-203. Alternatively, stress caused by thermal expansion could dissipate by second metal structure 107 sliding relative to fuzz buttons 200-203.

Figure 19:
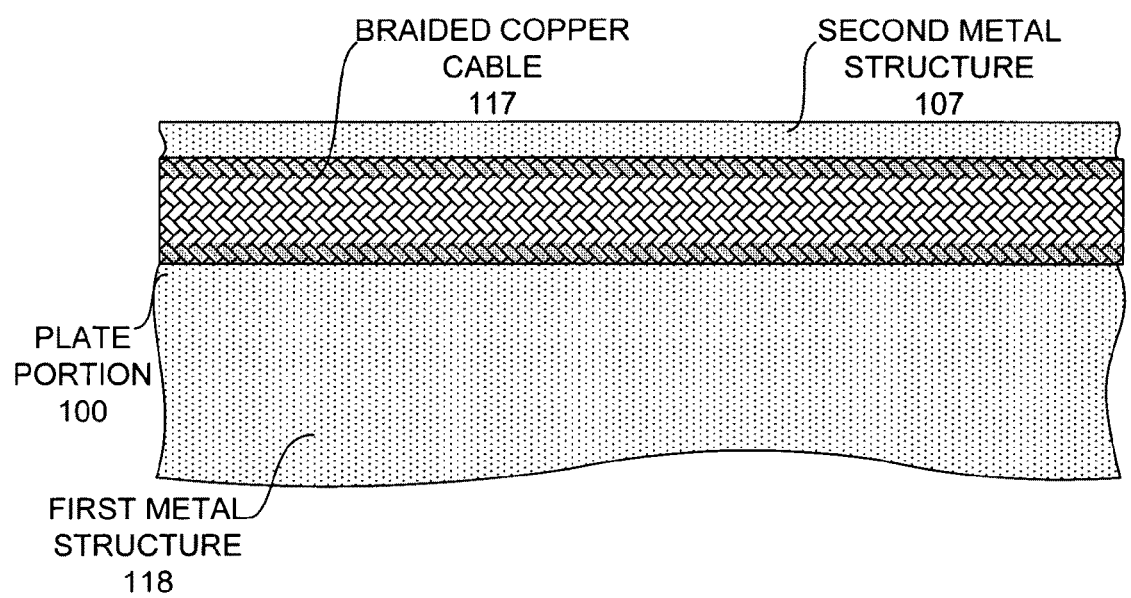
FIG. 19 is a cross-sectional drawing through a first metal structure, a braided metal cable and a second metal structure wherein the first metal structure, the second metal structure, and the braided cable are in electrical contact in accordance with one novel aspect.

FIG. 19 is a cross-sectional drawing showing another embodiment of the invention. FIG. 19 includes a first metal structure 118 with a plate portion 100; a second metal structure 107; and a braided copper cable 117. The braided copper cable is inserted between the plate portion 100 of first metal structure 118 and second metal structure 107. Braided copper cable is commercially available may be manufactured by braiding together strands of electrolytic copper wire. When first metal structure 118 is pressed against second metal structure 107, braided copper cable 117 compresses between the respective metal structures and is electrically connected to the metal structures. Because braided copper cable 117 is not adhesively fixed to either first metal structure 118 or second metal structure 107, delamination is not likely to occur when the structure is subject to temperature changes. Stress between the plate portion 100 of first metal structure 118, braided copper cable 117, and second metal structure 107 caused by a disparate amount of thermal expansion between first metal structure 118 and second metal structure 107 should be dissipated by sliding of the plate portion of first metal structure 118 relative to braided copper cable 117. Alternatively, stress caused by thermal expansion could be dissipated by second metal structure 107 sliding relative to braided copper cable 117. In yet another embodiment, first metal structure 118 is not present and only braided copper cable 117 supplies power to second metal structure 107 which is attached to a semiconductor substrate. Stress caused by thermal expansion is dissipated by second metal structure 107 sliding relative to braided copper cable 117. In other embodiments a conductive braided cable with a high degree of elastic deformation like beryllium copper is utilized.

In yet another embodiment, the braided copper cable 117 is bonded to the plate portion 100 of first metal structure 118 and is also bonded to the second metal structure 107. Stress between the plate portion 100 of first metal structure 118, braided copper cable 117, and second metal structure 107 caused by a disparate amount of thermal expansion between first metal structure 118 and second metal structure 107 should be dissipated by the flexible braids of braided copper cable 117.

Figure 20:
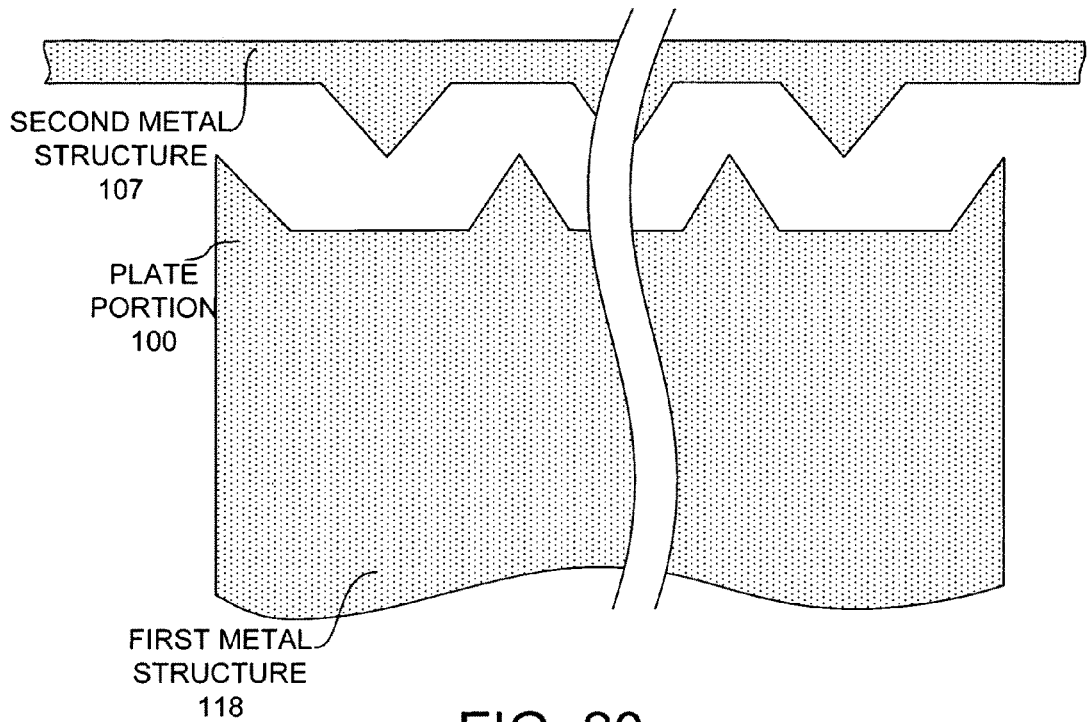
FIG. 20 is a cross-sectional drawing through a first metal structure and a second metal structure wherein the first and second metal structures have pyramid-shaped features and the first and second metal structures have not yet been pressed together.

FIG. 20 is a cross-sectional drawing showing another embodiment of the invention. FIG. 20 includes a first metal structure 118 with a plate portion 100 and a second metal structure 107. Pyramid-shaped features of plate portion 100 of first metal structure 118 are complimentary to pyramid-shaped features present on second metal structure 107. The complimentary surfaces in first metal structure 118 and second metal structure 107 are made by designing a pattern for first metal structure 118, creating a reverse field pattern by inverting the pattern used to create first metal structure 118, oversizing the features and then using that pattern to manufacture second metal structure 107.

Figure 21:
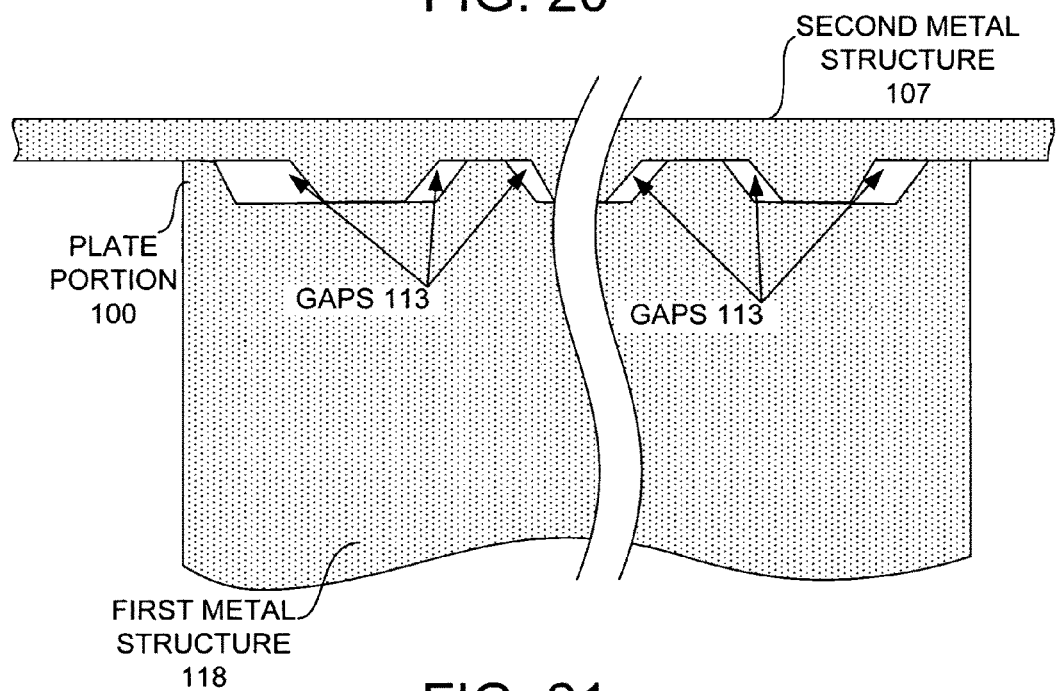
FIG. 21 is a cross-sectional drawing through a first metal structure and a second metal structure wherein the first and second metal structures have gaps that permit the first and second metal structures to slideably contact each other.

FIG. 21 is a cross-sectional drawing showing the embodiment of FIG. 20 after second metal structure 107 has been pressed together with first metal structure 118. FIG. 21 includes a first metal structure 118 with a plate portion 100 and a second metal structure 107. Features of plate portion 100 of first metal structure 118 are complimentary to features present on second metal structure 107 and contain gaps 113. Gaps 113 are present between all sides of each feature of first metal structure 118 and second metal structure 107. First metal structure 118 is in electrical contact with second metal structure 107 because the top surface of plate portion 100 of first metal structure 118 is in contact with the bottom surfaces of features on second metal structure 107. A portion of the pointed surfaces of the pyramid-shaped features of the second metal structure of FIG. 20 are flattened when pressed against first metal structure 118. Similarly, the pointed surfaces of the pyramid-shaped features of first metal structure 118 of FIG. 20 are flattened when pressed against second metal structure 107. The surface area of second metal structure 107 in contact with first metal structure 118 is reduced by the presence of gaps 113. Because gaps 113 reduce stress by both allowing first metal structure 118 and second metal structure 107 to slideably contact each other and by reducing the amount of surface area of both structures in contact with each other, delamination is less likely to occur. The gaps are formed such that the width of each gap is greater than the difference in expansion of the materials caused by an anticipated change in temperature.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. An apparatus comprising:
   a first integral metal structure comprising:
      a plate portion having a thickness in a Z dimension of at least one half of one millimeter; and
      a two-dimensional array of at least one hundred post portions, wherein the two-dimensional array extends in a plane that extends in a X dimension and a Y dimension, wherein the Z dimension is perpendicular to the plane, each of the post portions extending from the plate portion for a length, each post portion having a width that is less than one fifth of the length of the post portion, wherein an amount of fluid surrounds each post portion in a cross-sectional dimension, wherein all of the at least one hundred post portions are shorted together; and
   a second metal structure in electrical contact with each of the post portions of the first integral metal structure, wherein the first integral metal structure and the second metal structure are pressed together such that the post portions are disposed between the plate portion and the second metal structure, and wherein the second metal structure is a part of a semiconductor substrate.

2. The apparatus of claim 1, wherein the width of each of the post portions is less than five microns.

3. The apparatus of claim 1, wherein the length is greater than ten microns.

4. The apparatus of claim 1, wherein the semiconductor substrate having a width of at least one inch and a length of at least one inch.

5. The apparatus of claim 1, wherein the first integral metal structure is copper.

6. The apparatus of claim 1, further comprising:
   a gold layer disposed on the first integral metal structure.

7. The apparatus of claim 1, wherein the two-dimensional array extends in the X dimension for a distance of at least one inch.

8. The apparatus of claim 1, wherein each post portion is separated from each adjacent post portion by a distance of not more than the length of the post portion.

9. The apparatus of claim 1, further comprising:
   a second integral metal structure of substantially identical construction to the first integral metal structure, wherein the second integral metal structure is at a different electrical potential than the first integral metal structure.

10. The apparatus of claim 1, wherein the plate portion has a length of at least one inch.

11. An apparatus comprising:
    a metal layer portion attached to a semiconductor substrate; and
    means for providing power to the semiconductor substrate through the metal layer portion without causing delamination of the metal layer portion from the semiconductor substrate, wherein the means contacts the metal layer portion through a plurality of post portions for a distance of more than one inch.

12. The apparatus of claim 11, wherein the means is an integral metal structure including a plate portion, the plurality of post portions extending from the plate portion.

13. The apparatus of claim 12, wherein each post portion has a width of less than five microns and a length of more than five times the width.

14. The apparatus of claim 13, wherein an amount of fluid surrounds each post portion in a cross-sectional dimension.

15. The apparatus of claim 14, wherein the means is made substantially entirely of copper.

16. The apparatus of claim 11, further comprising:
    a second metal layer portion attached to the semiconductor substrate; and
    a second means for providing power to the semiconductor substrate, wherein the means for providing power and the second means for providing power are of substantially identical structure, and wherein the second means contacts the second metal layer portion through a plurality of post portions for a distance of more than one inch.

17. The apparatus of claim 11, wherein the semiconductor substrate has a width of at least one inch and a length of at least one inch.

18. The apparatus of claim 11, further comprising:
    a gold layer disposed on the means.

19. The apparatus of claim 11, wherein each post portion is separated from each adjacent post portion by a distance of not more than the length of the post portion.

20. The apparatus of claim 11, wherein the means includes a plate portion, wherein the post portions extend from the plate portion, and wherein plate portion has a thickness of at least one half of one millimeter.

* * * * *